United States Patent
Suzuki et al.

(10) Patent No.: US 7,184,491 B2
(45) Date of Patent: Feb. 27, 2007

(54) WIRELESS COMMUNICATION APPARATUS

(75) Inventors: May Suzuki, Kokubunji (JP); Satoshi Tanaka, Kokubunji (JP); Taizo Yamawaki, Tokyo (JP); Tomonori Tanoue, Machida (JP)

(73) Assignee: Htachi, Ltd., Tokyo (JP)

( * ) Notice: Subject to any disclaimer, the term of this patent is extended or adjusted under 35 U.S.C. 154(b) by 639 days.

(21) Appl. No.: 10/655,045

(22) Filed: Sep. 5, 2003

(65) Prior Publication Data

US 2004/0071225 A1     Apr. 15, 2004

(30) Foreign Application Priority Data

Sep. 5, 2002   (JP) ............................. 2002-259526
Feb. 26, 2003  (JP) ............................. 2003-048484

(51) Int. Cl.
*H04K 1/02*      (2006.01)
(52) U.S. Cl. ............... 375/297; 375/298; 332/103; 332/107; 330/10
(58) Field of Classification Search .............. 375/302; 330/302, 136, 10; 333/216; 332/103, 151, 332/159, 106; 455/91, 108
See application file for complete search history.

(56) References Cited

U.S. PATENT DOCUMENTS

| | | | |
|---|---|---|---|
| 5,138,274 A * | 8/1992 | Nakanishi et al. | 330/136 |
| 5,251,330 A * | 10/1993 | Chiba et al. | 455/91 |
| 5,861,777 A | 1/1999 | Sigmon et al. | |
| 6,252,461 B1 * | 6/2001 | Raab | 330/302 |
| 6,256,482 B1 * | 7/2001 | Raab | 455/108 |

(Continued)

FOREIGN PATENT DOCUMENTS

WO       0229969      4/2002

OTHER PUBLICATIONS

F. Raab, Ph.D., "Drive Modulation in Kahn-Technique Transmitters", 1999 IEEE MTT-S Digest, vol. 2, Jun. 13, 1999, pp. 811-814.
K. Chiba, "Linearized Saturation Amplifier", Communications: Connecting the Future, Dec. 2-5, 1990, Proceedings of the Global Telecommunications Conference and Exhibition, vol. 3, pp. 1958-1962.

*Primary Examiner*—Tesfaldet Bocure
*Assistant Examiner*—Sudhanshu C. Pathak
(74) *Attorney, Agent, or Firm*—Mattingly, Stanger, Malur & Brundidge, P.C.

(57) ABSTRACT

A linear system and an EER system are used in combination such that the EER system can also be used in a cellular phone with a wide output dynamic range. In the EER system, linear control of an amplifier becomes difficult in a low output range. Thus, use of the EER system is limited to a high output range, and the linear system is used in the low output range as in the past. A power efficiency is improved while requirements of linearity are satisfied by this structure. An effective circuit structure is proposed for a switching control system for two systems. In addition, an up-converter is constituted in combination with a step-down element with high responsiveness, whereby a power supply voltage control circuit for the EER system with a wide control range and high responsiveness is provided.

19 Claims, 14 Drawing Sheets

U.S. PATENT DOCUMENTS

| | | | |
|---|---|---|---|
| 6,552,634 B1* | 4/2003 | Raab | 333/216 |
| 6,813,319 B1* | 11/2004 | Nagle et al. | 375/302 |
| 6,822,523 B2* | 11/2004 | Grosspietsch et al. | 332/149 |
| 2001/0014593 A1 | 8/2001 | McCune | |
| 2001/0054931 A1 | 12/2001 | Bar-David | |
| 2002/0024388 A1 | 2/2002 | Nitta | |
| 2004/0008081 A1* | 1/2004 | Friedel et al. | 330/10 |
| 2004/0017251 A1* | 1/2004 | Mitzlaff | 330/10 |

* cited by examiner

WIRELESS COMMUNICATION APPARATUS

BACKGROUND OF THE INVENTION

The present invention relates to structures of an apparatus, which performs transmission in a wireless communication system such as a cellular phone or a wireless LAN, and an integrated circuit which is used as a component in the apparatus. In particular, the present invention relates to a wireless communication apparatus for a wireless communication system which adopts a modulation system for transmitting information according to changes in both of a phase and an amplitude.

First, with reference to FIG. 7, a relation between input/output characteristics and a power efficiency of a power amplifier, which consumes largest electric power in a transmission apparatus for a wireless communication system and influences a power efficiency of the entire transmission apparatus, will be described (the figure is a schematic diagram and may not be always consistent with power efficiency characteristics of an individual power amplifier in some points). As it is seen from a curve 701 of the input/output characteristics, when an input power is increased while conditions of a circuit such as a bias voltage constant are kept, an output power of the power amplifier increases before a saturation point 702 in proportion to a log (dB) of the input power but becomes substantially constant regardless of the input power around or after the saturation point 702. A former region in which the output is proportional to the input is referred to as a linear region 703 and a latter region in which the output saturates to be constant is referred to as a saturation region 704. Linearity of the amplifier (a degree to which a transmission signal can be amplified while a form thereof is kept faithfully) is higher in the linear region. In the saturation region, since the form of the transmission signal is distorted largely, modulation accuracy and characteristics of spurious radiation to the outside of a communication channel band is deteriorated. On the other hand, a power efficiency 705 is higher in the saturation region. In the linear region, the power efficiency 705 is deteriorated rapidly as the input power falls. It is possible to vary a position and an input/output characteristic curve of the saturation point 702 by changing conditions of a peripheral circuit such as a bias voltage.

In a modulation system for transmitting information according to a change in a phase while keeping an amplitude of a transmission signal constant (e.g., BPSK: Binary Phase Shift Keying), distortion of an amplitude direction of the signal does not cause a problem. Therefore, in a wireless communication system using such a modulation system, it is a general practice to use a saturation region of an amplifier attaching importance to a power efficiency (hereinafter referred to as saturation amplifier). On the other hand, in a modulation system for transmitting information according to a change in only an amplitude or both of an amplitude and a phase (e.g., 16QAM: quadrature Amplitude Modulation), high linearity is required because data cannot be distinguished correctly on a reception side when a transmission signal is distorted. Therefore, in a wireless communication system using such a modulation system, it is a general practice to use a linear region of an amplifier attaching importance to linearity (hereinafter referred to as linear amplifier).

Here, with reference to FIG. 2, a structure of a transmission system wireless unit and an interface unit of a wireless communication terminal using a conventional linear amplifier will be described (see FIG. 1 and the section of the preferred embodiments of the invention about an overall structure of the terminal). A transmission IQ signal from a base band unit 201 is converted into an analog signal by DACs (Digital-to-Analog Converters) 203 and 204 in the interface unit 202 and subjected to filtering. Then, the signal is changed to a signal of a frequency in a desired frequency band by a quadrature modulator 206 in an RF-IC 205, subjected to gain adjustment conforming to transmission power control by an AGC (Automatic Gain Control) amplifier 207, amplified by a power amplifier 208, and then transferred to a front-end unit. In this structure, since the linear amplifier is used, it is easy to satisfy linearity but a power efficiency is low compared with the saturation amplifier.

A technique for increasing linearity by controlling an efficient saturation amplifier from the outside has also been studied. What is well known theoretically is an EER (Envelope Elimination and Restoration) system, an example of application of which to a wireless transmitter has been studied by F. H. Raab, et al. (F. H. Raab et al, "L-Band Transmitter Using Kahn EER Technique", IEEE Trans. Microwave Theory Tech, vol. 46, pp. 2220–2225, De. 1998)

Next, with reference to FIG. 3, the principle of the EER system and a structure of the conventional transmission system wireless unit and interface unit using the EER system will be described. A transmission IQ signal 310 (801 and 802 in FIG. 8) from a base band unit 301 is separated into an amplitude component 311 and a phase component 312 (803 and 804 in FIG. 8) by an Rθ conversion section 305. More specifically, in this processing, a result obtained by synthesizing vectors of IQ components is divided into two. An amplitude of one component is limited by a limiter to be changed to a signal of a constant amplitude to include only phase information, and the other component is subjected to envelope detection to include only amplitude information. In this example, conversion processing is performed after changing a digital transmission signal into an analog signal by DACs 303 and 304. However, it is also possible to apply this processing to a digital transmission signal, and then convert the digital transmission signal into an analog signal. The phase component 312 is converted into a signal of a frequency in a desired frequency band by a mixer 307 in an RF-IC 306 and is inputted to a power amplifier 308. In this structure, since the saturation amplifier is used, an output has a constant amplitude regardless of an amplitude of an input signal (see 704 in FIG. 7). The amplitude component 311 is converted into a power supply voltage modulation signal of the power amplifier 308 by an amplitude modulation circuit 309 in the RF-IC 306 and is inputted to a power supply voltage pin of the power amplifier 308. By modulating a power supply voltage of the power amplifier, an envelope of an output waveform is changed to obtain a high frequency/high power output 313 having the same form as an original waveform.

With this system, since an efficient saturation amplifier can be used even in a wireless communication system including amplitude modulation, a highly efficient transmission system can be realized compared with the conventional system using a linear amplifier. However, as it is also apparent from FIG. 7, an amplifier deviates from the saturation region in a range in which an output power is low, and efficiency is deteriorated. In addition, since a dynamic range of an output power depends upon a variable range of a power supply voltage (range in which a change in an output power is proportional to a change in a power supply voltage), it is difficult to enlarge the range compared with the linear system in which a dynamic range is obtained by adjusting an input power. Therefore, this system has been considered unsuitable for a wireless communication system in which an output power changes sharply over a wide range, that is, a modulation system with a large PAPR (Peak to Average Power ratio) of a signal is used or an average level of an output power changes over a wide range by transmission power control.

In a cellular phone system of the second generation such as GSM (Global System for Mobile Communications), since a phase modulation system was mainly used, many wireless terminals used a saturation amplifier to obtain a power efficiency close to 60%. However, in a cellular phone system of the third generation and a wireless LAN system which have started service one after another in recent years, since a frequency usage ratio is required to be increased in order to cope with an increase in a data rate and an increase in the number of users, a multilevel modulation system which can transmit a larger amount of information at a time is often used. In the multilevel modulation system, since high linearity is required, many wireless terminals use a liner amplifier. However, a power efficiency thereof is 40 to 45% at the most, and an average power efficiency over all ranges of an output power is as low as 8 to 10%. Thus, an increase in power consumption is a problem. In particular, in a portable terminal driven by a battery, a reduction in power consumption (i.e., improvement of a power efficiency) is a significant object because it affects a continuous operation time. Therefore, a new technique has been required which reduces power consumption while satisfying a modulation accuracy and a provision of spurious radiation to the outside of a communication channel band.

SUMMARY OF THE INVENTION

In the present invention, in order to meet the above-described requirements, the conventional linear system and EER system are used in combination such that the EER system can also be used in a terminal for a system with a wide output dynamic range. The use of the EER system is limited to the time when an output power is constant and the linear system is used in a low output range as in the past, whereby power consumption of the terminal is reduced while the requirements of linearity is satisfied. An effective circuit structure is proposed for a switching control system for switching the two systems and partial sharing of a circuit.

In addition, the present invention provides a power supply voltage control circuit for the EER system with a wide control range and high responsiveness by combining an up-converter with a step-down element (regulator, etc.) with high responsiveness. The present invention also indicates a technique for analyzing transmission signal waveform information prior to output by a power amplifier to determine the necessity of switching of the systems or step-up and, at the same time, generating a control signal sent to each element.

Other objects, features and advantages of the invention will become apparent from the following description of the embodiments of the invention taken in conjunction with the accompanying drawings.

DETAILED DESCRIPTION OF THE EMBODIMENTS

Figure 1:
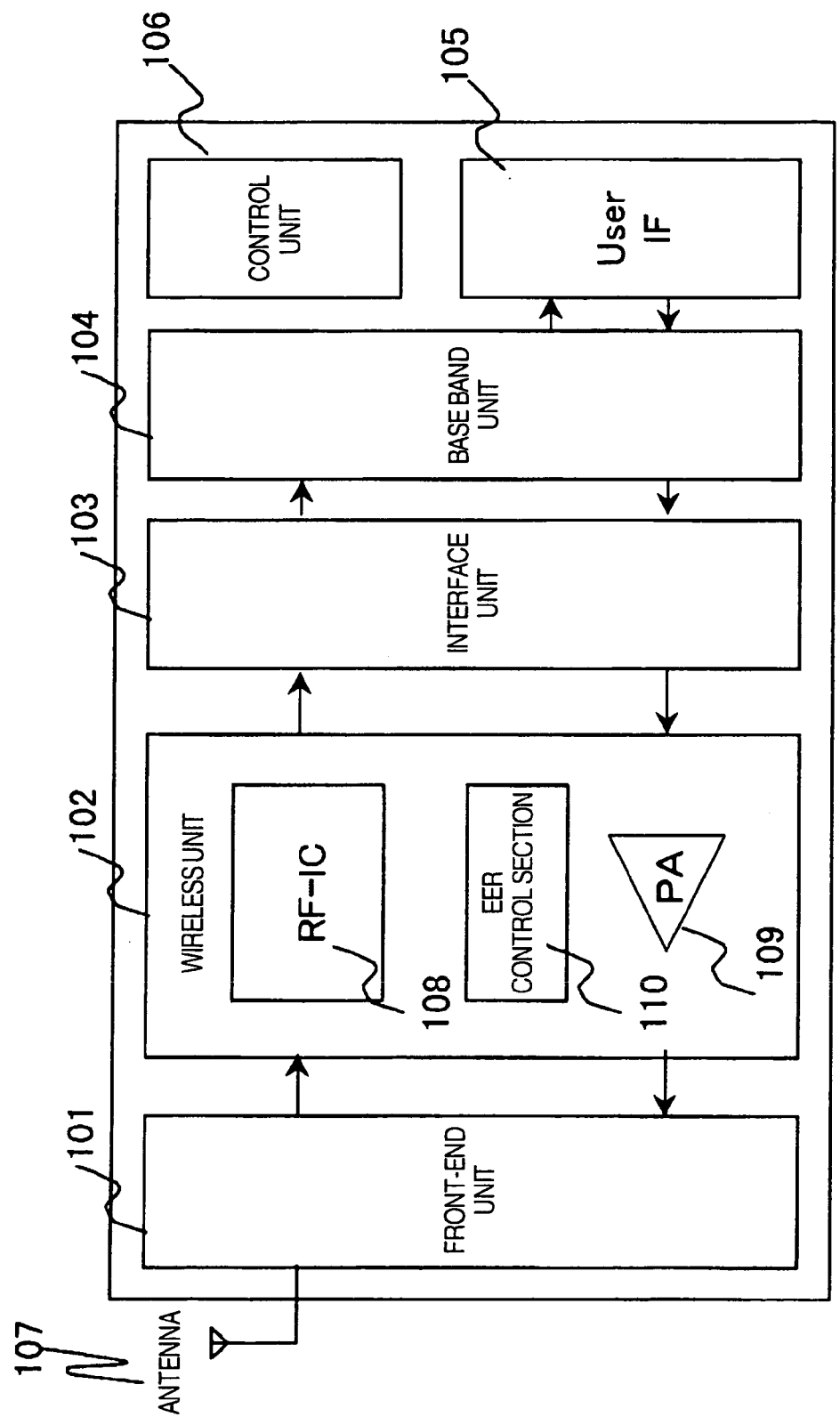
FIG. 1 is a diagram illustrating a general structure of a terminal used in a wireless communication system.
Figure 2:
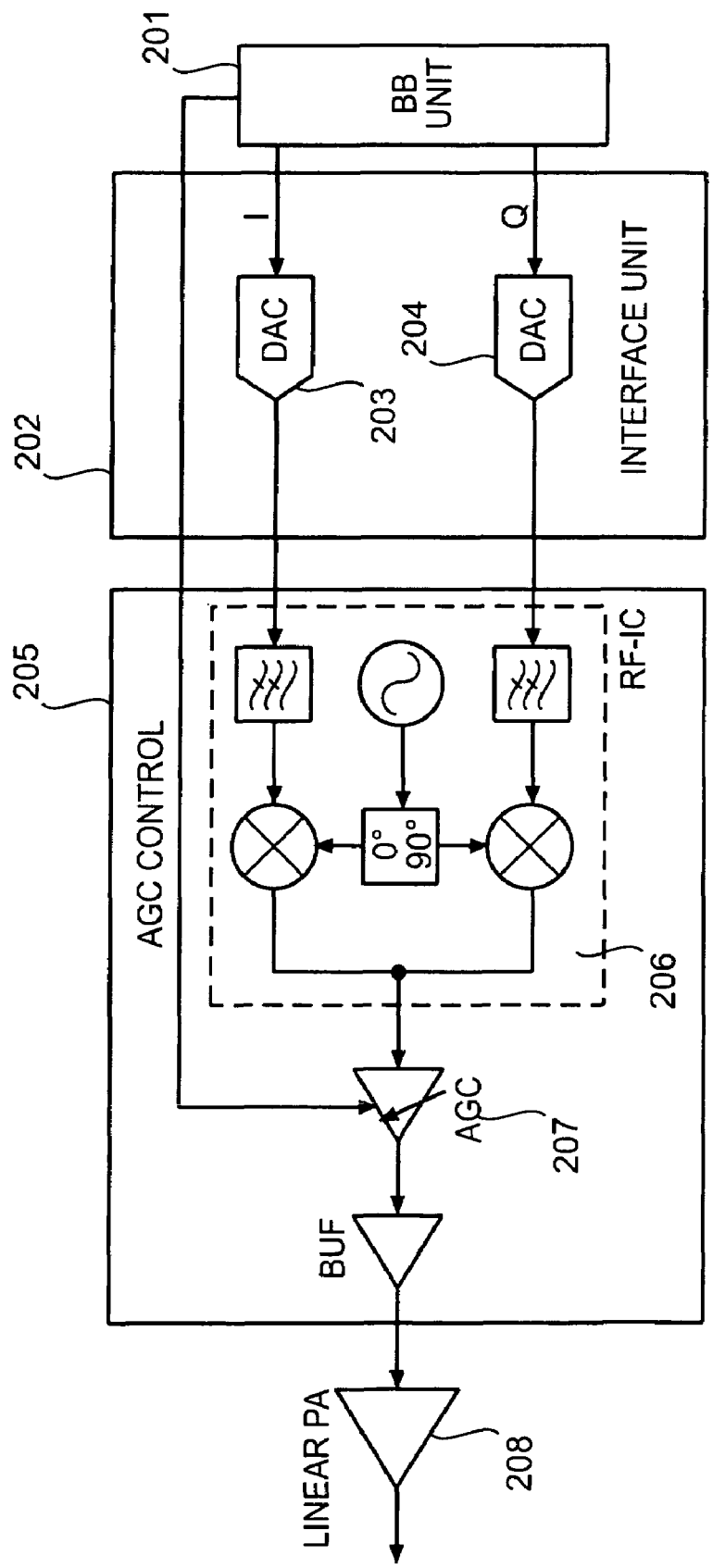
FIG. 2 is a diagram showing an example of a structure of a transmission system wireless unit and an interface unit according to a conventional linear system.
Figure 3:
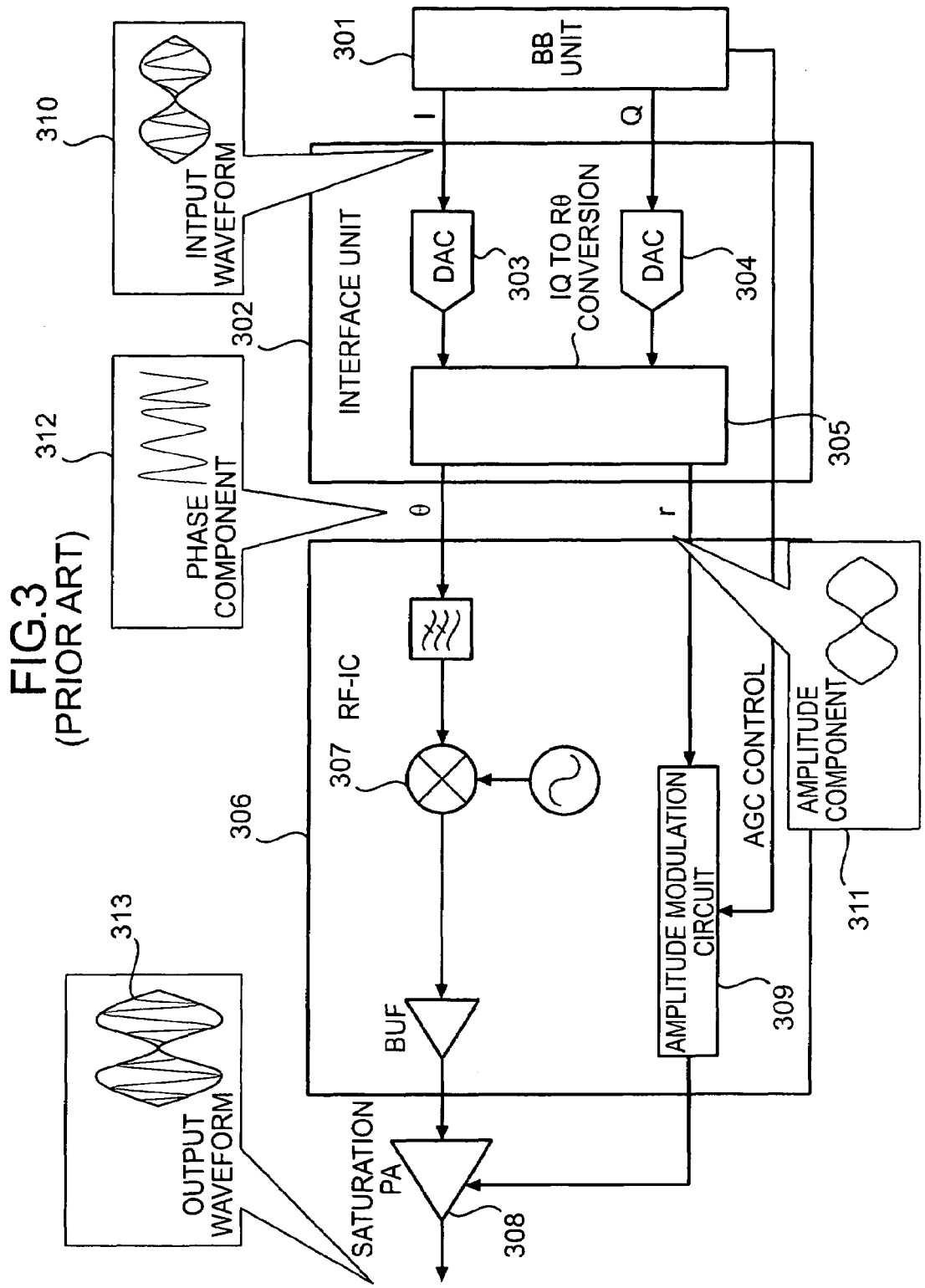
FIG. 3 is a diagram showing an example of a structure of a transmission system wireless unit and an interface unit according to a conventional EER system.

First, a general structure of a terminal used in a wireless communication system will be described with reference to FIG. 1. A reception signal received by an antenna 107 is subjected to transmission/reception separation by an antenna switch (or duplexer) in a front-end unit 101 and subjected to filtering, and then is subjected to frequency conversion to be brought into a base band. Moreover, the signal is converted into a digital signal in an interface unit 103, demodulated in a base band unit 104, and outputted via a user interface unit 150 to be served for processing after that. In addition, a transmission signal sent to a base station is inputted to a base band unit 104 via the user interface unit 105 and subjected to modulation processing such as error correction coding. Thereafter, the transmission signal is converted into an analog signal in the interface unit 103, changed to a signal of a frequency in a desired frequency band by a wireless unit 102, filtered by the front-end unit 101, and then sent from the antenna 107. A control unit 106 performs setting of a parameter value, timing control, and the like for respective sections using a CPU or a DSP. In particular, the present invention relates to a circuit constitution technique for a radio frequency integrated circuit (RF-IC) 108, a power amplifier 109, and an EER control section 110, which are main components of the wireless unit 102, and an interface unit 103 among the components. It is physically possible to constitute the interface unit 103 as a part of the base band unit 104, as a part of the RF-IC 108, or as a part of the EER control section 110. In addition, it is possible to constitute the EER control section 110 as a part of the RF-IC 108 or to combine it with the power amplifier 109 to form a power amplifier module of the EER system.

Figure 4:
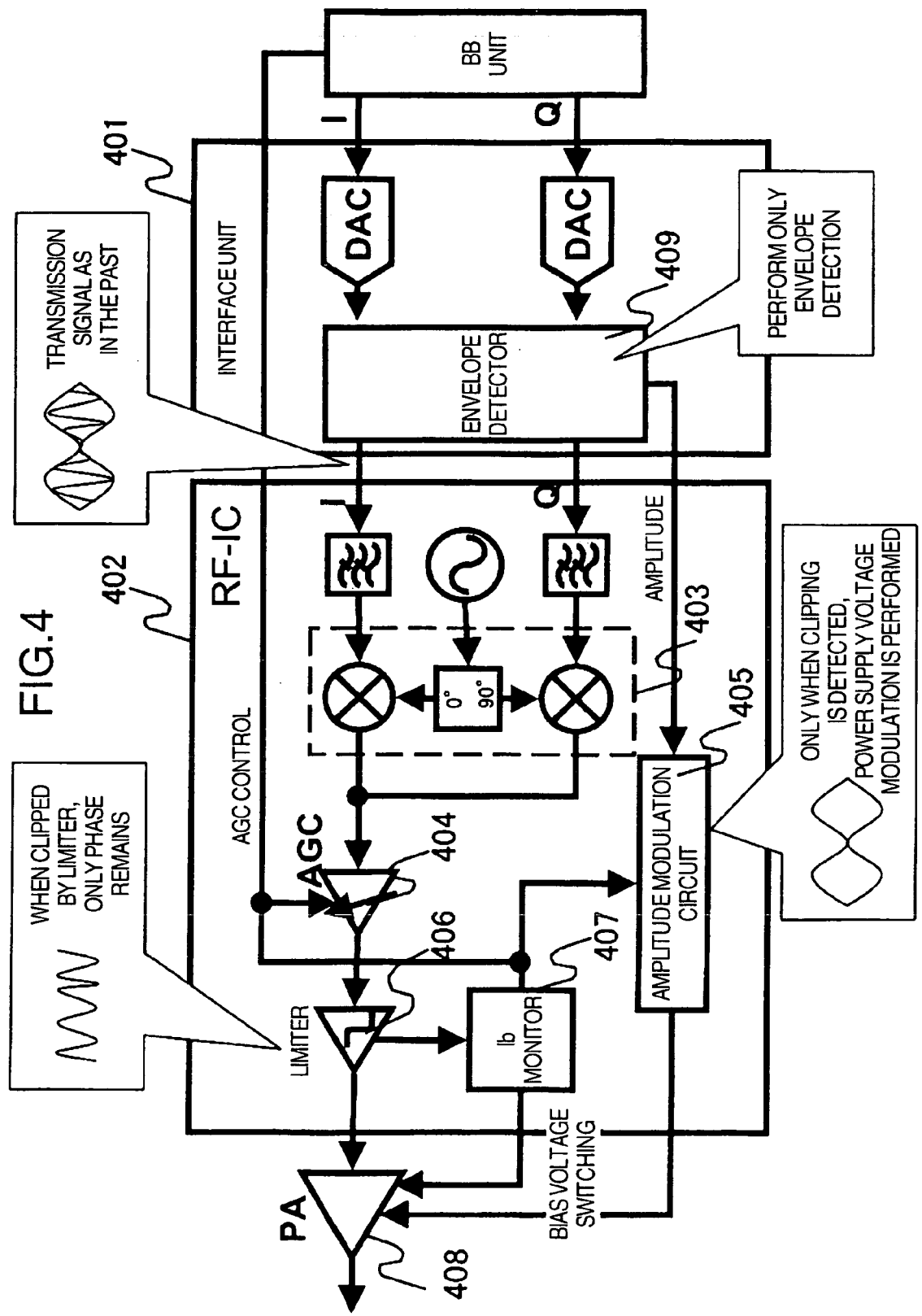
FIG. 4 is a diagram showing an example of a structure of a transmission system wireless unit and an interface unit according to a first embodiment of the present invention.

Next, with reference to FIG. 4, a first embodiment of a structure of a transmission system wireless unit and an interface unit according to the present invention will be described. In this embodiment, only envelope detection (extraction of amplitude information) is performed rather than the Rθ conversion in an envelope detection section 409 of an interface unit 401, and an original transmission signal as IQ-separated and amplitude information are outputted to an RF-IC 402. The RF-IC 402 subjects the IQ-separated input signal to frequency conversion with an quadrature modulator 403 as in the past and amplifies the input signal in accordance with transmission power control with an AGC amplifier 404. Note that, although the quadrature modulator is used here, it is obvious that, even if a circuit structure is different, the same effect can be obtained if contents of processing are equivalent. A limiter 406 connected to a later stage of the AGC amplifier 404 clips an input signal of a fixed threshold voltage or more. Since a base current Ib increases when clipping is performed in the limiter, an Ib monitor block 407 monitors a base current of the limiter and, upon detecting that the clipping has been performed, switches an enable signal of the amplitude modulation circuit 405 to valid. The amplitude modulation circuit 405 converts inputted amplitude information into a power supply voltage modulation signal of the power amplifier 408 and, when an enable signal from an Ib monitor 407 serving as a control section is valid, outputs the power supply voltage modulation signal to a power supply voltage pin of the power amplifier 408. In addition, upon detecting that the clipping has been performed, the Ib monitor block 407 changes a bias voltage setting of the power amplifier 408 such that a saturation point falls and causes a bias voltage to saturate at an output power. When the clipping has not been performed, the Ib monitor block 406 changes the bias voltage setting such that the saturation point rises and causes the bias voltage not to saturate at the output power. In this way, the conventional linear system and the conventional EER system are combined, and the user of the EER system is limited to the time when a power is equal to or more than a fixed value, whereby the user of a saturation amplifier with a high power efficiency is made possible even in standards of a cellular phone or the like with a wide output dynamic range. This embodiment is characterized in that algorithm verification is easy because the switching of the linear system/the EER system is performed only by the RF-IC and that determination of the switching is performed based upon monitor information of a base current Ib of the limiter.

Figure 5:
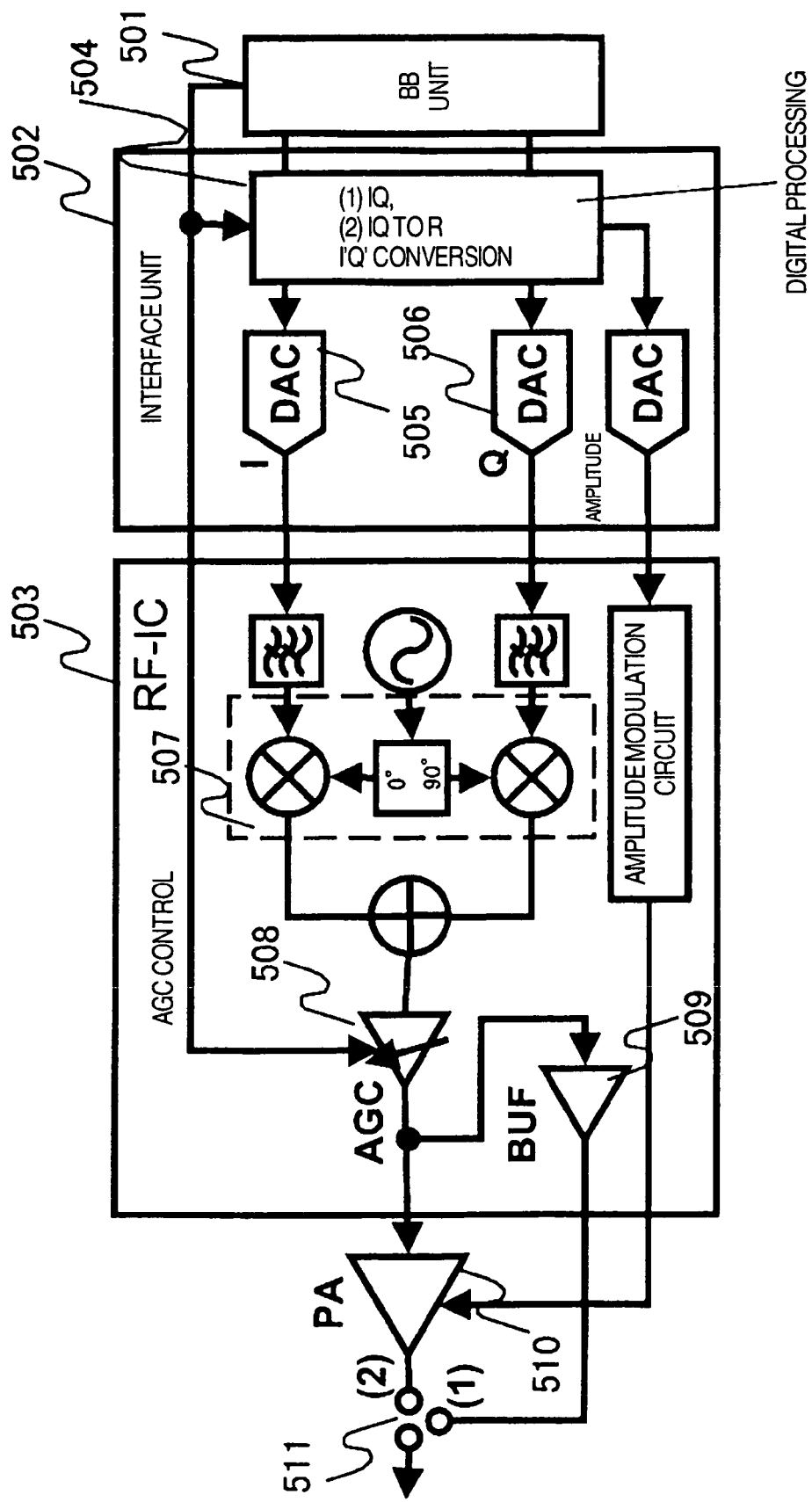
FIG. 5 is a diagram showing an example of a structure of a transmission system wireless unit and an interface unit according to a second embodiment of the present invention.
Figure 8:
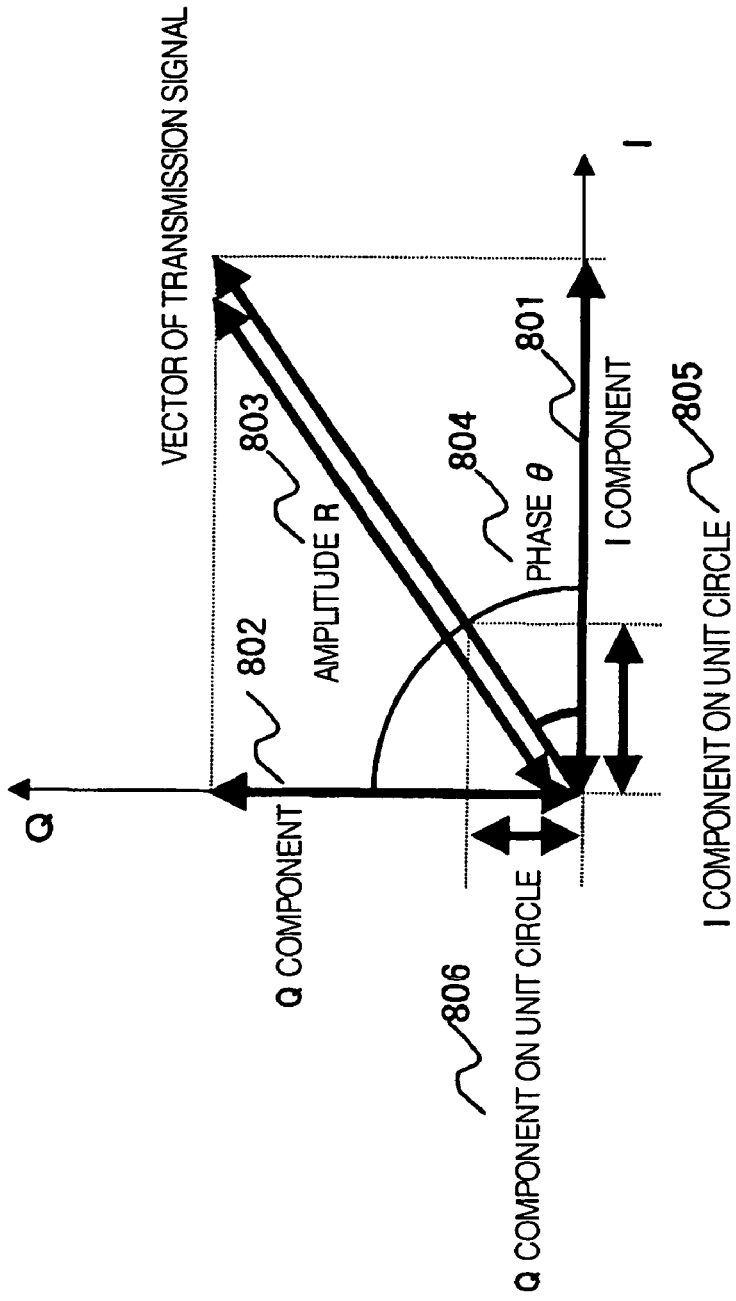
FIG. 8 is a conceptual diagram of IQ to Rθ conversion.

Next, with reference to FIG. 5, a second embodiment of the structure of the transmission system wireless unit and the interface unit according to the present invention will be described. In this embodiment, an Rθ conversion section 504 of an interface unit 502 is placed in front of DACs 505 and 506 to realizes its function according to digital signal processing. The Rθ conversion section 504 performs switching of the linear system/the EER system based upon transmission power level information from the base band unit 501. When the linear system is used, the Rθ conversion section 504 through-outputs a signal without performing signal processing. When the EER system is used, the Rθ conversion section 504 performs separation and extraction of amplitude information and phase information. The amplitude information is extracted by envelope detection as described earlier. Since the phase information is treated more easily in the RF-IC when it is represented by perpendicular two-component IQ, in this embodiment, the phase information is represented by IQ on a unit circle and outputted to an RF-IC 503 (805 and 806 in FIG. 8). As described earlier, the RF-IC 503 subjects an input signal represented by IQ on the unit circle to frequency conversion with a quadrature modulator 507 and amplifies the input signal in accordance with transmission power control with an AGC amplifier 508. Note that, although the quadrature modulator is used here, it is obvious that, even if a circuit structure is different, the same effect can be obtained if contents of processing are equivalent. When the output is equal to or more than a fixed threshold value, an output of the AGC amplifier 508 is connected to a power amplifier 510 and amplified using the EER system. When the output is equal to or less than the fixed threshold value, the output of the AGC amplifier 508 is also connected to the power amplifier 510. However, the output is amplified using a linear region of the power amplifier 510 by changing parameter settings such as a bias voltage and adjusting an output level with the AGC amplifier 508. When the output is small, it is unnecessary to amplify a signal much. If the signal is amplified through a power amplifier, the signal may be affected by distortion of the amplifier to have a deteriorated quality on the contrary. Thus, the output of the ACC amplifier 508 is connected to a buffer 509, and the signal is outputted to the front-end unit not through the power amplifier 510. It is desirable to use a low-loss switch as a switch 511 for output selection because the switch 511 passes through a signal after amplification. In addition, in switching a connection and amplification method, it is advisable that, by separately setting a first threshold value of a transmission output power to be a judgment reference in switching from the linear system to the EER system and a second threshold value of the transmission output power to be a judgment reference in switching from the EER system to the linear system, hysteresis is given to the threshold values such that switching is not performed frequently in the case where the transmission output power changes frequently astride first and second threshold values. This embodiment is characterized in that the switching of systems and the Rθ conversion processing are realized by the digital signal processing and a threshold value for the switching and a system of conversion can be changed easily by software correction, that the judgment on switching can be performed based upon transmission power level information from a base band unit, and that hysteresis is given to the threshold value in the switching.

Figure 6:
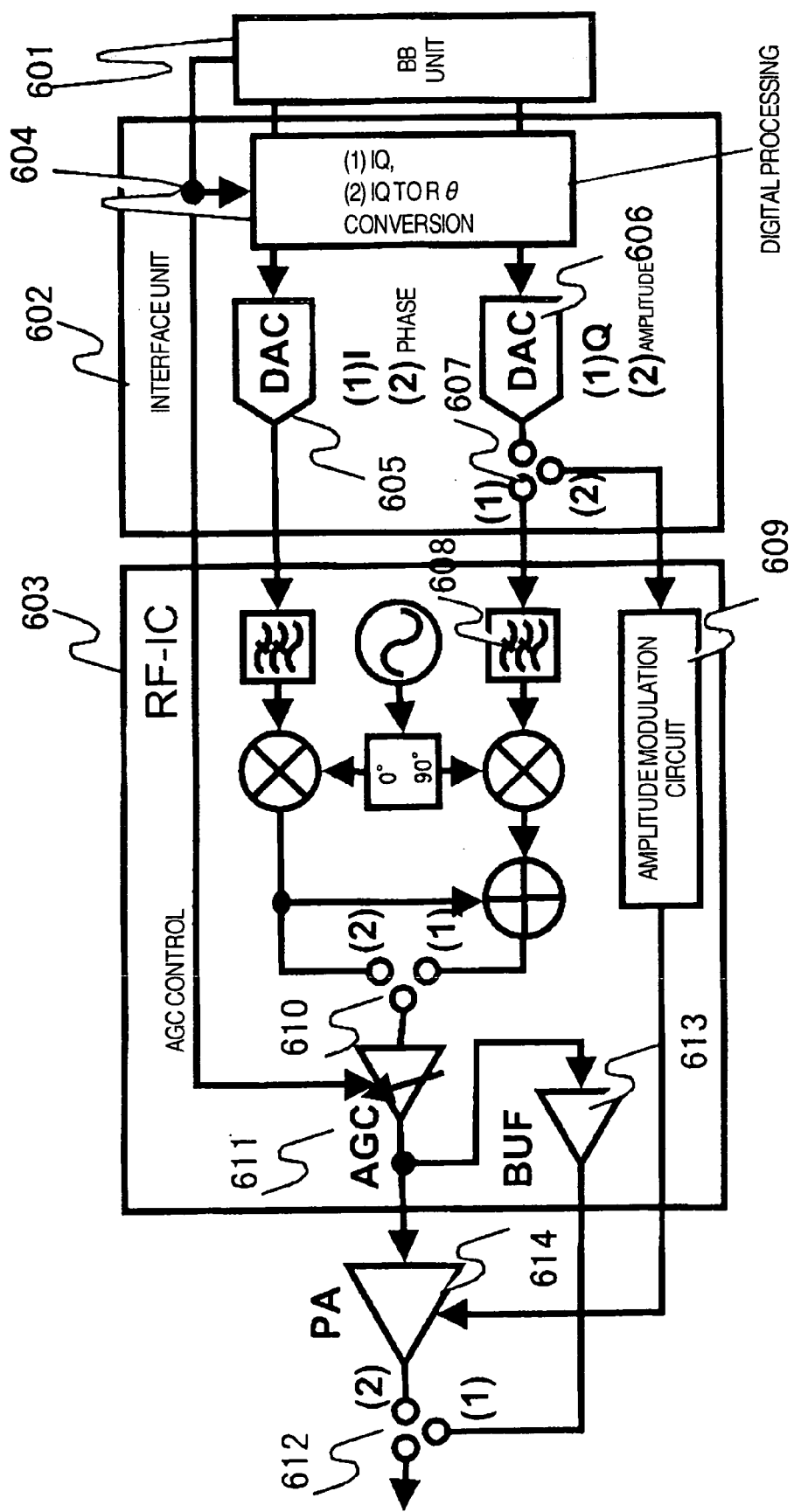
FIG. 6 is a diagram showing an example of a structure of a transmission system wireless unit and an interface unit according to a third embodiment of the present invention.
Figure 7:
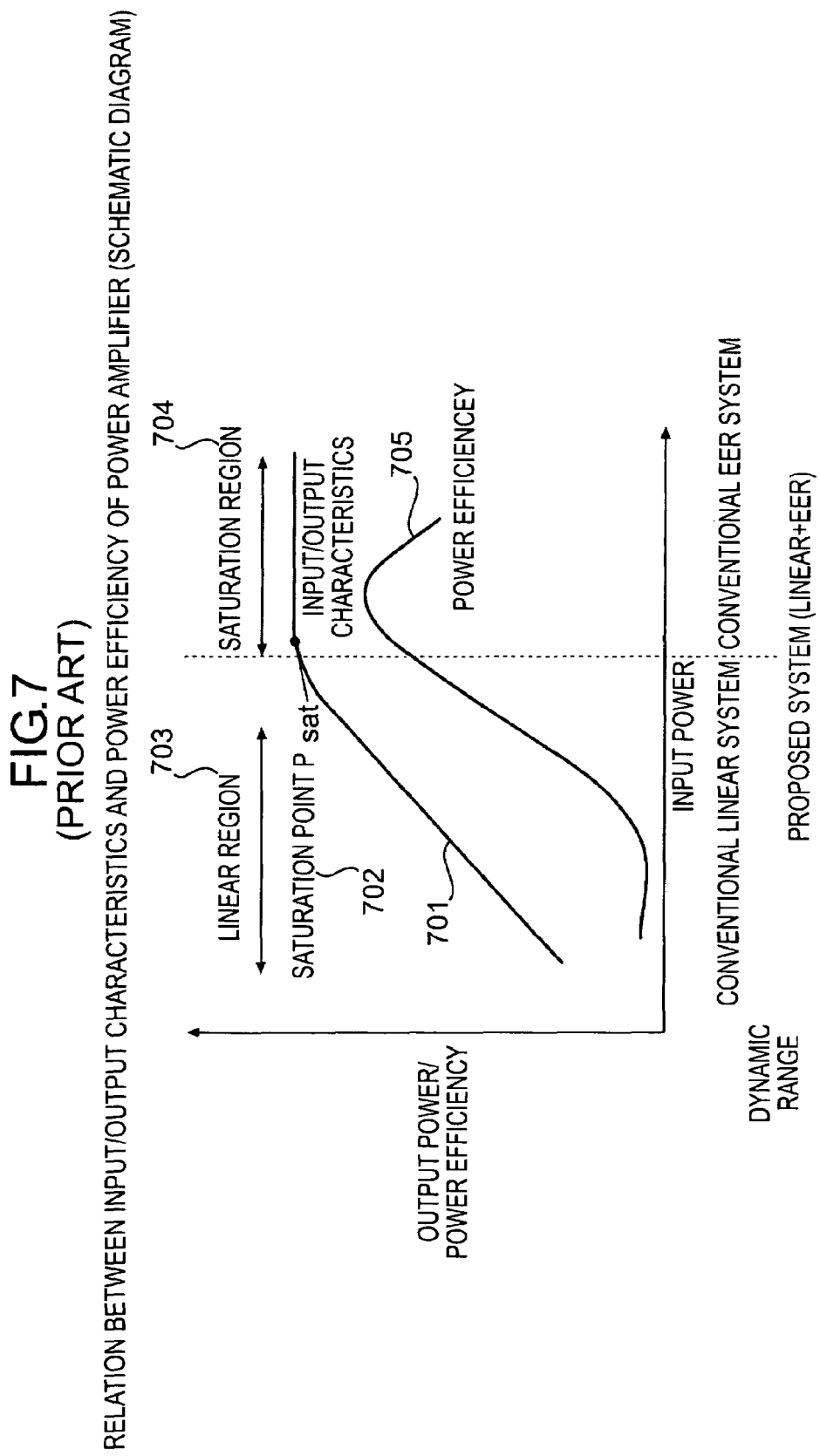
FIG. 7 is a schematic diagram showing a relation between input/output characteristics and a power efficiency of a power amplifier.

Further, with reference to FIG. 6, a third embodiment of the structure of the transmission system wireless unit and the interface unit according to the present invention will be described. As in the second embodiment, in this embodiment, a function of an Rθ conversion section 604 of an interface section 602 is realized by the digital signal processing, and the linear system and the EER system are switched based upon transmission power level information from a base band unit 601. When the linear system is used, the Rθ conversion section 604 through-outputs a signal without performing signal processing. When the EER system is used, the Rθ conversion section 604 performs separation and extraction of amplitude information and phase information. As in the conventional EER system, the Rθ conversion processing in this embodiment performs extraction of phase information according to a limiter and extraction of amplitude information according to envelope detection. In the following description, the case in which an output is equal to or less than a fixed threshold value and the linear system is used is referred to (1), and the case in which an output is equal to or more than the threshold value and the EER system is used is referred to as (2). In the case of (1), an I component is inputted to a DAC 605 and, in the case of (2), amplitude information is inputted to the DAC 605. In the case of (1), a Q component is inputted to a DAC 606 and, in the case of (2), amplitude information is inputted to the DAC 606. In the case of (1), a switch 607 connects an output of the DAC 606 to a base band filter for a Q component of the RF-IC and, in the case of (2), the switch 607 connects the output to an amplitude modulation circuit. In the case of (1), a switch 610 connects a sum of the IQ components to an AGC amplifier 611 and, in the case of (2), the switch 610 connects only the phase component to the AGC amplifier 611. In the case of (1), a switch 612 connects an AGC amplifier output to a buffer 613 and connects the output to the front-end unit not through a power amplifier 614. In the case of (2), the switch 612 connects the output to the power amplifier 614 and amplifies the output using the EER system. This embodiment is characterized in that a DAC is shared by the linear system and the EER system, and an increase in a circuit size is suppressed.

Figure 9:
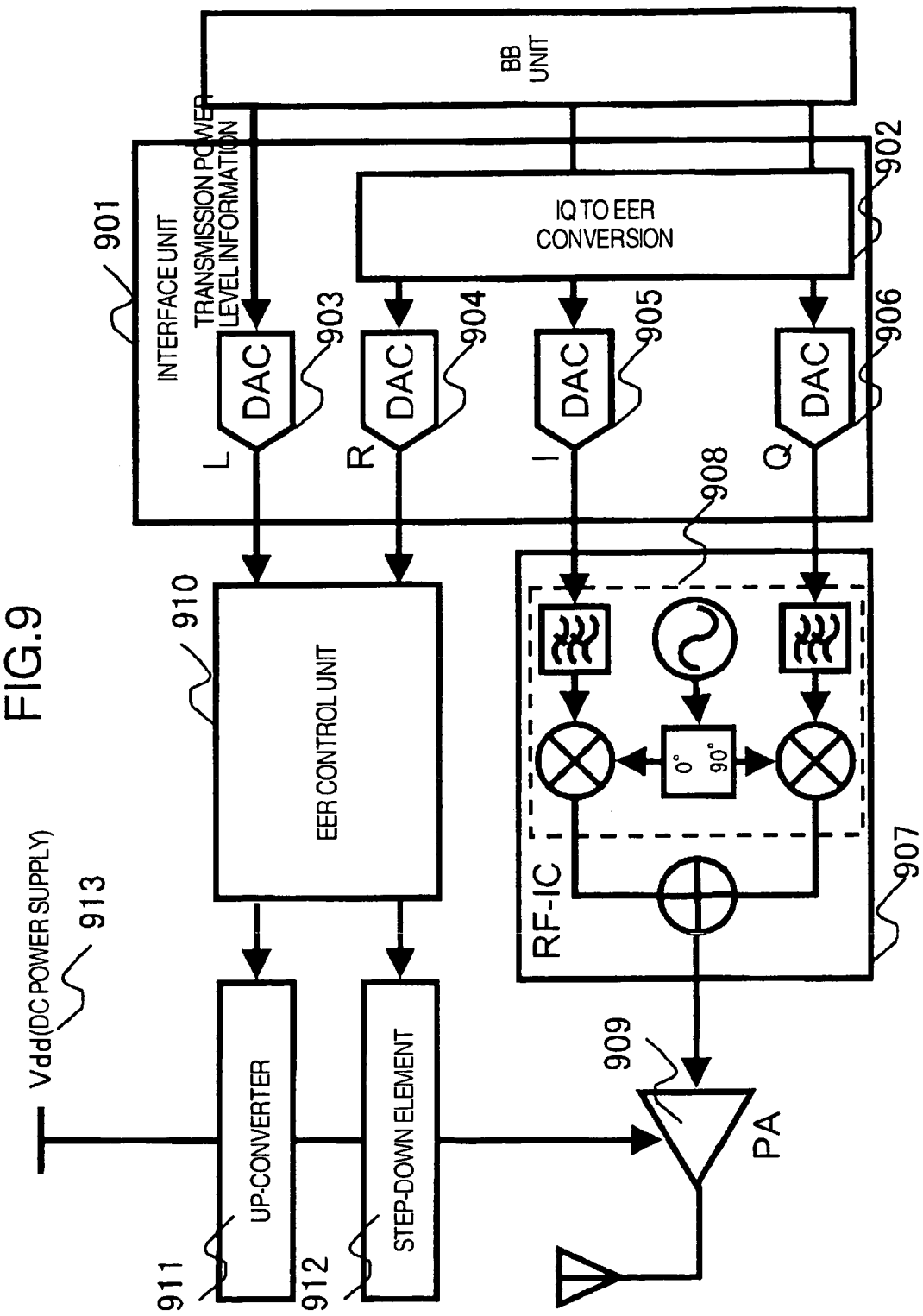
FIG. 9 is a diagram showing an example of a structure of a transmission system wireless unit and an interface unit according to a fourth embodiment of the present invention.

Next, a structure shown in FIG. 9 will be described as a fourth embodiment of a transmission wireless unit and an interface unit which realize the EER system. Although embodiments described below shows structures corresponding to only the EER system, the same effect can be obtained even if the EER system is used in combination with the linear system as described in the first to third embodiments. In addition, in this embodiment, an IQ to EER conversion section 902 of an interface unit 901 is placed in front of DACs 904 to 906 and a function thereof is realized by digital signal processing. However, even if the function is realized by analog signal processing, the same effect can be obtained if a function is equivalent. The IQ to EER conversion section 902 separates and extracts amplitude information and phase information. The phase information is represented by an IQ orthogonal components projected on a unit circle and outputted to an RF-IC 907. In addition, separately from a transmission signal, transmission power level information L is also sent to an EER control unit 910 from the base band unit 104 via a DAC 903 of the interface unit 901. The RF-IC 907 subjects an input signal represented by IQ on a unit circle to frequency conversion with a quadrature modulator 908. A result obtained by subjecting the input signal to the frequency conversion and IQ synthesizing is inputted to a signal input pin of a saturation type power amplifier 909. Note that, although the IQ representation on a unit circle and the frequency conversion by the quadrature modulator are used here, even if the circuit structure is different, the same effect can be obtained if contents of processing are equivalent. On the other hand, amplitude information R is inputted to the EER control unit 910 and, together with transmission power level information L, separated and converted into control signals for an up-converter and a step-down element, and then supplied to an up-converter 911 and a step-down element 912. The up-converter 911 and the step-down element 912 are connected to a DC power supply Vdd 913 in series and controls a power supply voltage for driving the power supply voltage pin of the power amplifier 909. Since an output voltage of the saturation type power amplifier 909 basically changes in proportion to the power supply voltage, envelope modulation of an output signal can be performed by controlling the power supply voltage. Note that, even if voltage control is applied not only to a terminal on the power supply voltage side of the power amplifier but also to a terminal on the ground side, the same effect can be obtained if a voltage applied to the power amplifier is the same. However, in this case, it is necessary to change an input of the power amplifier to a differential input.

Figure 14:
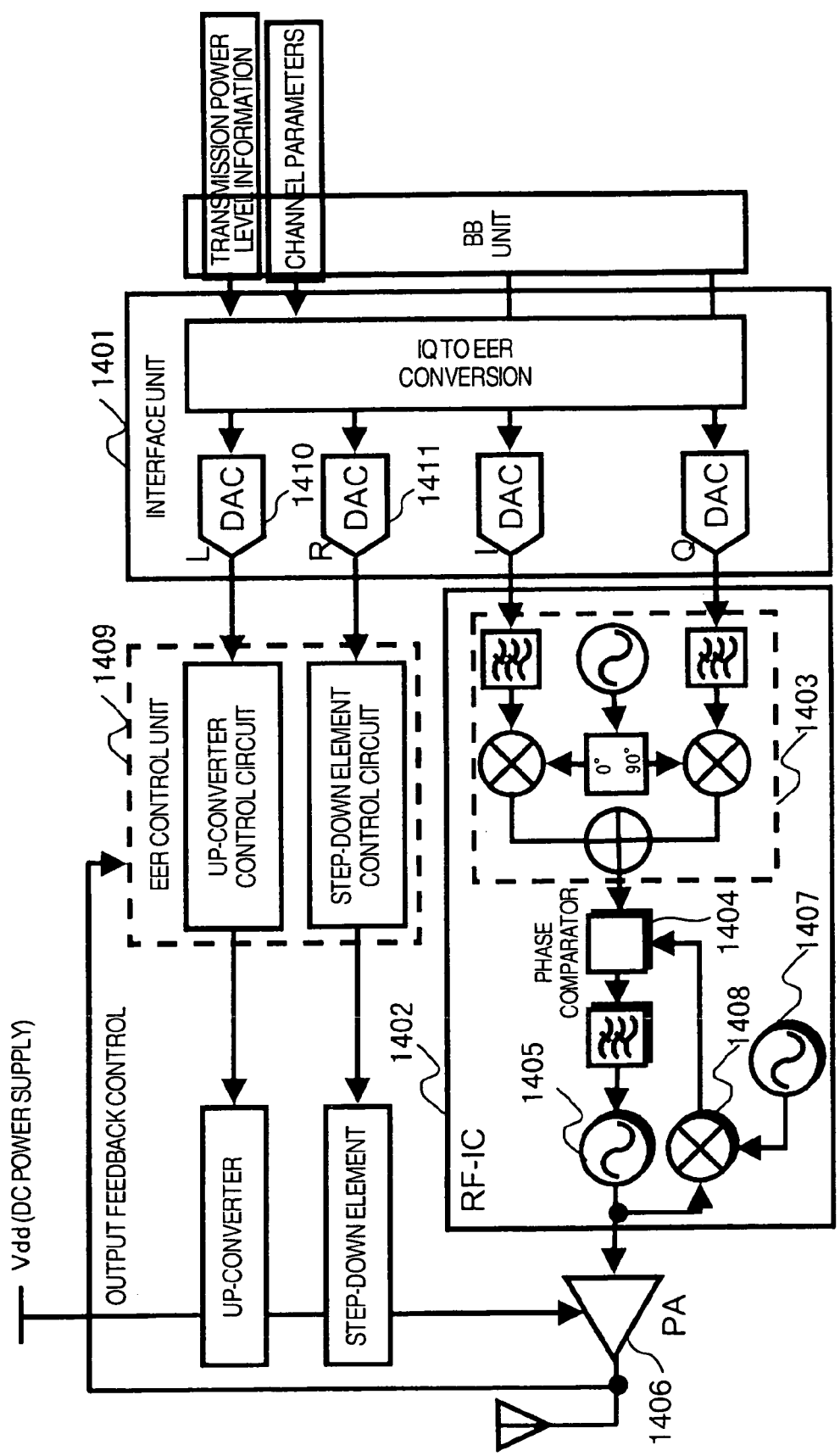
FIG. 14 is a diagram showing an example of a structure of a transmission system wireless unit and an interface unit according to a fifth embodiment of the present invention.

Next, with reference to FIG. 14, a fifth embodiment of the structure of the transmission system wireless unit and the interface unit according to the present invention will be described. In this embodiment, an offset PLL system as described in T. Yamawaki et al., "A 2.7-V GSM RF Transceiver IC" IEEE Journal of Solid-State Circuits, vol. 32, No. 12, pp 2089–2096, December 1997 is used in an RF-IC 1402.

An input signal from an interface unit 1401 is subjected to frequency conversion into an IF frequency band by a quadrature modulator 1403, and a result obtained by IQ synthesizing is inputted to a frequency control terminal of an RF-VCO 1405 through a phase comparator 1404. An output of the RF-VCO 1405 is amplified by a power amplifier 1406 and, on the other hand, divided by a coupler, mixed with a local signal 1407 of an IF frequency by a mixer 1408, and fed back to the phase comparator 1404. In this embodiment, a control signal L 1410 to an up-converter and a control signal R 1411 to a step-down element are separated and converted by digital signal processing in an IQ to EER conversion section in the interface unit. Consequently, processing load on an EER control unit 1409 can be reduced. It is also possible to perform the separation and conversion processing in a base band unit. An output signal of the power amplifier 1406 is divided by the coupler and fed back to the EER control unit 1409. A structure for returning a feedback signal to the interface unit or the base band unit is also possible. It is also possible to replace the respective components of the example of the structure shown in FIG. 14 with equivalent components of the fourth embodiment individually.

Figure 11:
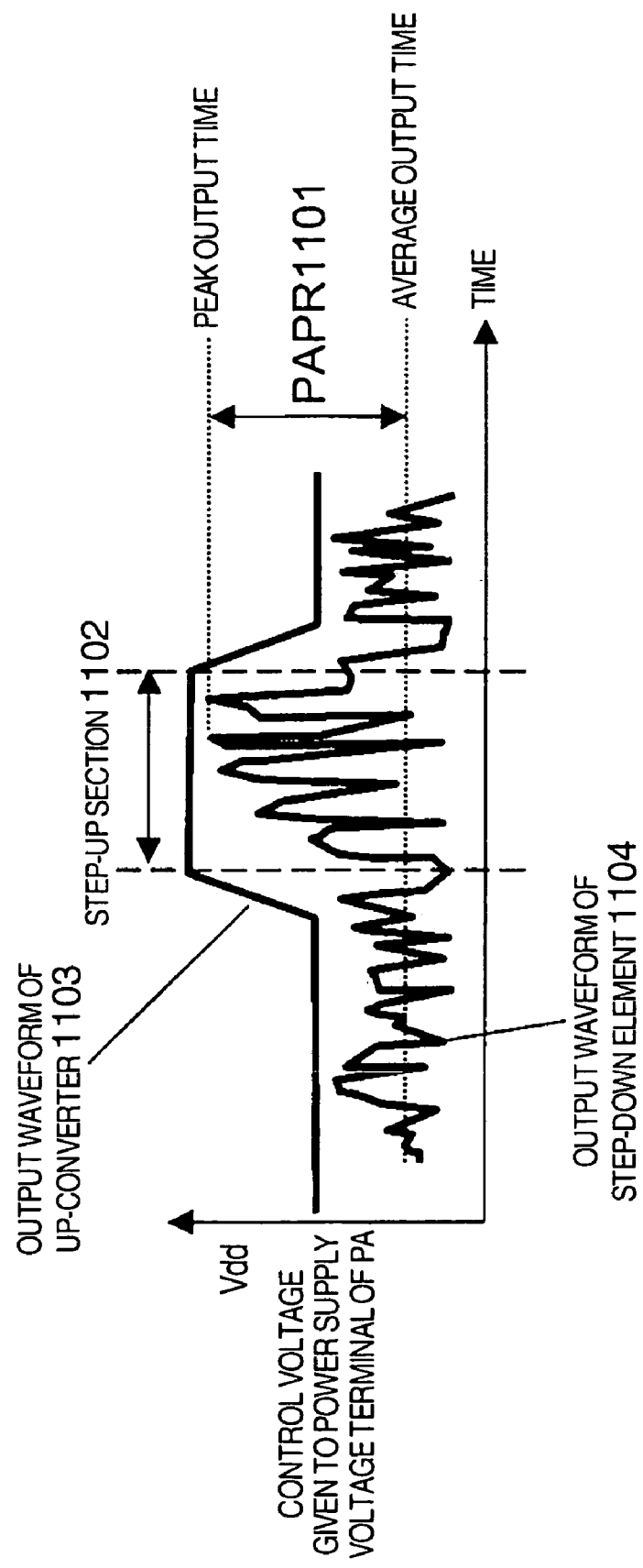
FIG. 11 is a diagram showing a first embodiment of the transmission power control according to the present invention.

Next, with reference to FIG. 11, a first embodiment of transmission output control according to the present invention will be described. A wireless communication system using an OFDM (Orthogonal Frequency Division Multiplexing) system such as IEEE802.11a is characterized in that a PAPR501 (Peak to Average Power Ratio) is as large as 12 to 17 dB. In order to apply the EER system to a system with a wide instantaneous range of change of a transmission output, it is necessary to increase a power supply voltage control range of a power amplifier as much as possible. However, the power supply voltage control range of the power amplifier is usually about 2 to 3 V and, in order to control a transmission output to change as much as 12 dB (approximately fifteen times) within this range, it is necessary to make an inclination of power supply voltage/transmission output characteristics steep, which is difficult to realize. In this embodiment, using an up-converter, only in a section 1102 in which a transmission power is larger than an average value, a power supply voltage of the power amplifier is stepped up to a value compared with a power supply voltage of a DC power supply and a control voltage is decreased to a required value, whereby high-speed envelope modulation is performed. An output voltage waveform of the up-converter is denoted by reference numeral 1103 and an output voltage waveform of a step-down element is denoted by 1104.

Figure 13:
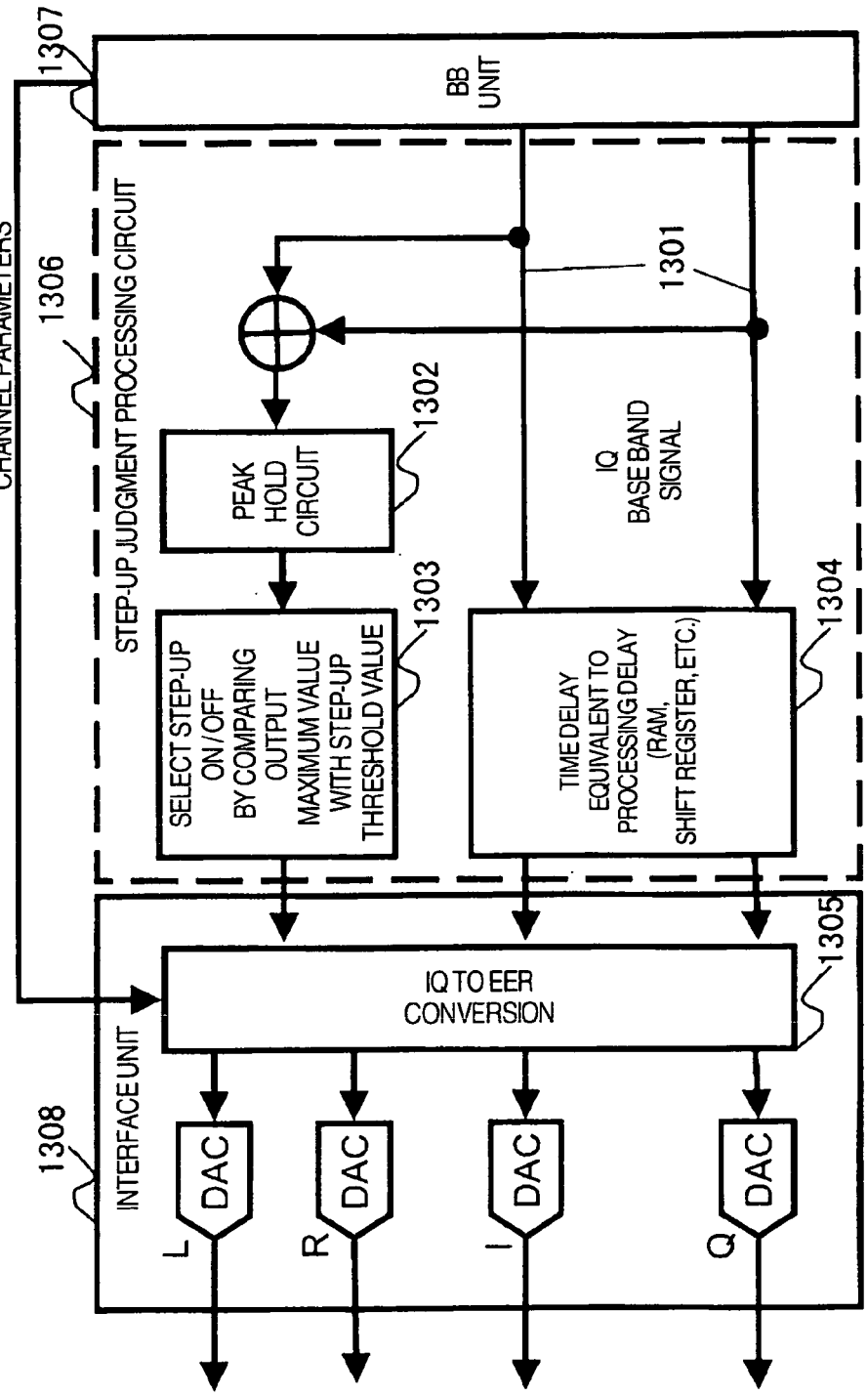
FIG. 13 is a diagram showing a step-up judgment processing circuit for the transmission power control according to the present invention.

FIG. 13 shows an example of a structure of a circuit necessary for determining a range of the step-up section 1102. IQ transmission signals 1301 modulated by a base band unit are synthesized, and a maximum value of a base band signal is detected by a peak hold circuit 1302. A step-up switch threshold value and an output maximum value are compared in 1303. If the output maximum value is larger than the threshold value, step-up ON is selected and, if the output maximum value is smaller than the threshold value, step-up OFF is selected. Step-up ON or step-up OFF is set in an IQ-EER conversion section 1305 in an interface unit 1308 or an EER control unit. In order to correct processing delay of the blocks 1302 and 1303 and processing circuit delay Tdc of an EER control unit 110 in a later stage, it is necessary to delay an input transmission signal to the IQ-EER conversion section 1305. A memory, a shift register, or the like is used for a delay element 1304. It is possible to include a step-up judgment circuit 1306 in any one of a base band unit 1307, the interface unit 1308, and the EER control unit 110 in view of its structure.

Figure 12:
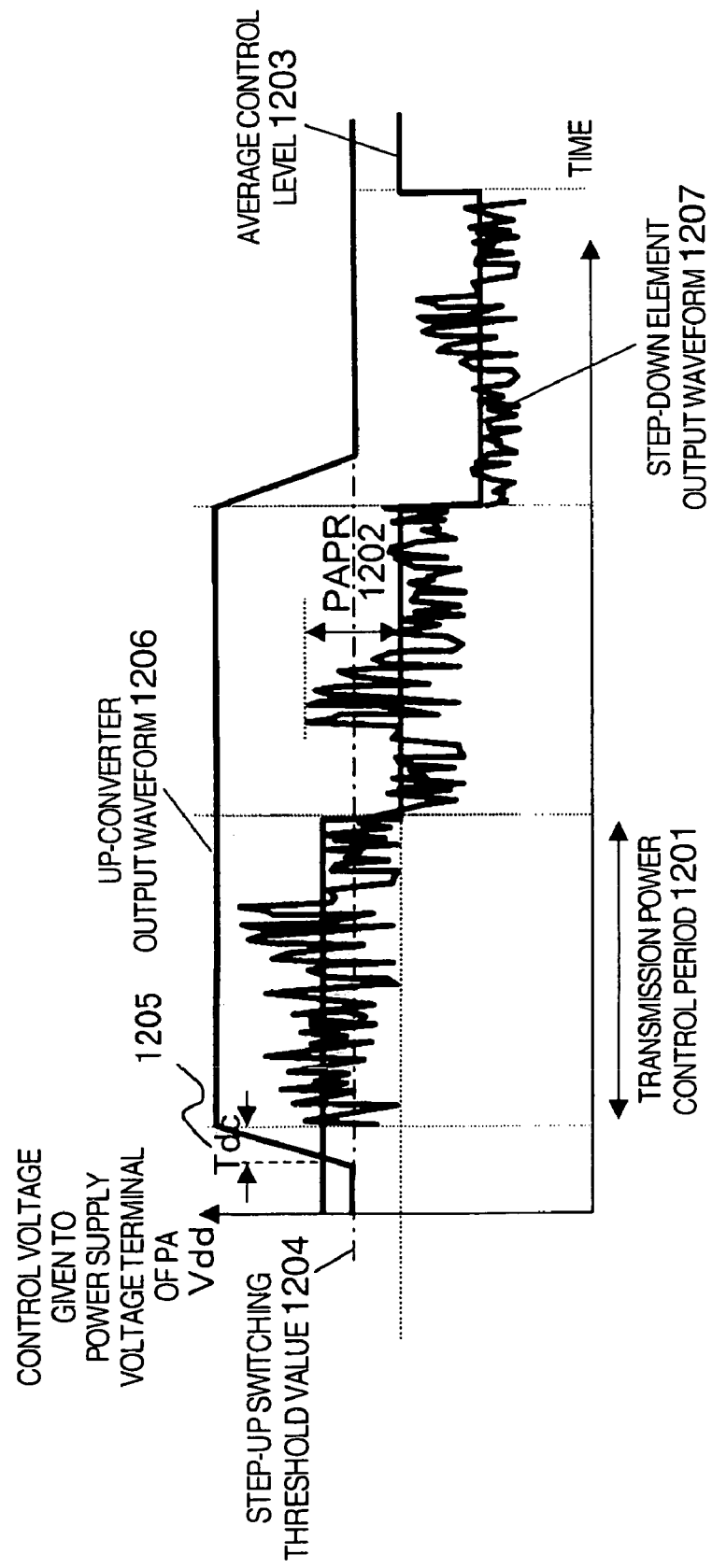
FIG. 12 is a diagram showing a second embodiment of the transmission power control according to the present invention.

Next, with reference to FIG. 12, a second embodiment of the transmission output control according to the present invention will be described. In this embodiment, although an up-converter is used as in the first embodiment, a method of determining a step-up section is different. Transmission output waveforms are compared one after another to step up a voltage only in necessary sections in the first embodiment, whereas presence or absence of step-up is judged only once in a transmission power control period to step up a voltage in an entire control period section 1201 thereof if step-up is necessary in this embodiment. Although a power efficiency is decreased slightly by reducing the number of times of judgment on a step-up section, power consumption of a control circuit is reduced because processing load decreases. In addition, it is also realizable, from the viewpoint of a control period, that the base band unit 104 is caused to judge a step-up section and the interface unit 103 only follows a control signal. Judgment on whether or not a voltage is step up in the certain control period section 1201 is performed based upon a maximum PAPR value 1202 and an average transmission power control level value 1203 found from parameters of a channel in transmission (a modulation system to be used, the number of channels to be simultaneously multiplexed and sent, a power ratio among channels, a bit adjustment method with respect to each channel output and output after synthesizing, etc.). When the maximum PAPR value 1202+the average control level value 1203<a step-up switch threshold value 1204, step-up is turned OFF and, when the maximum PAPR value 1202+the average transmission power control level value 1203≧the step-up switch threshold value 1204, step-up is turned ON. In the case where sections of step-up OFF are continuous according to conditions of the channel parameters, unless parameters relating to the above-described judgment expressions are changed, operations of the judgment circuit itself are stopped or suspended. Since the up-converter requires time equivalent to the circuit delay Tdc until an output voltage actually rises after starting control, the transmission power control is started before timing, at which transmission power control is actually desired, by a time equivalent to Tdc 1205. In the case where the up-converter is returned to its original state, conversely, a control voltage is changed after the control section has completely ended. An output voltage waveform of the up-converter is denoted by reference numeral 1206, and an output voltage waveform of a step-down element is denoted by 1207. Note that, as to judgment on switching the linear system and the EER system in the second and third embodiments, it is possible to reduce load on the control circuit by reducing the number of times of judgment with the same method as described above.

Figure 10:
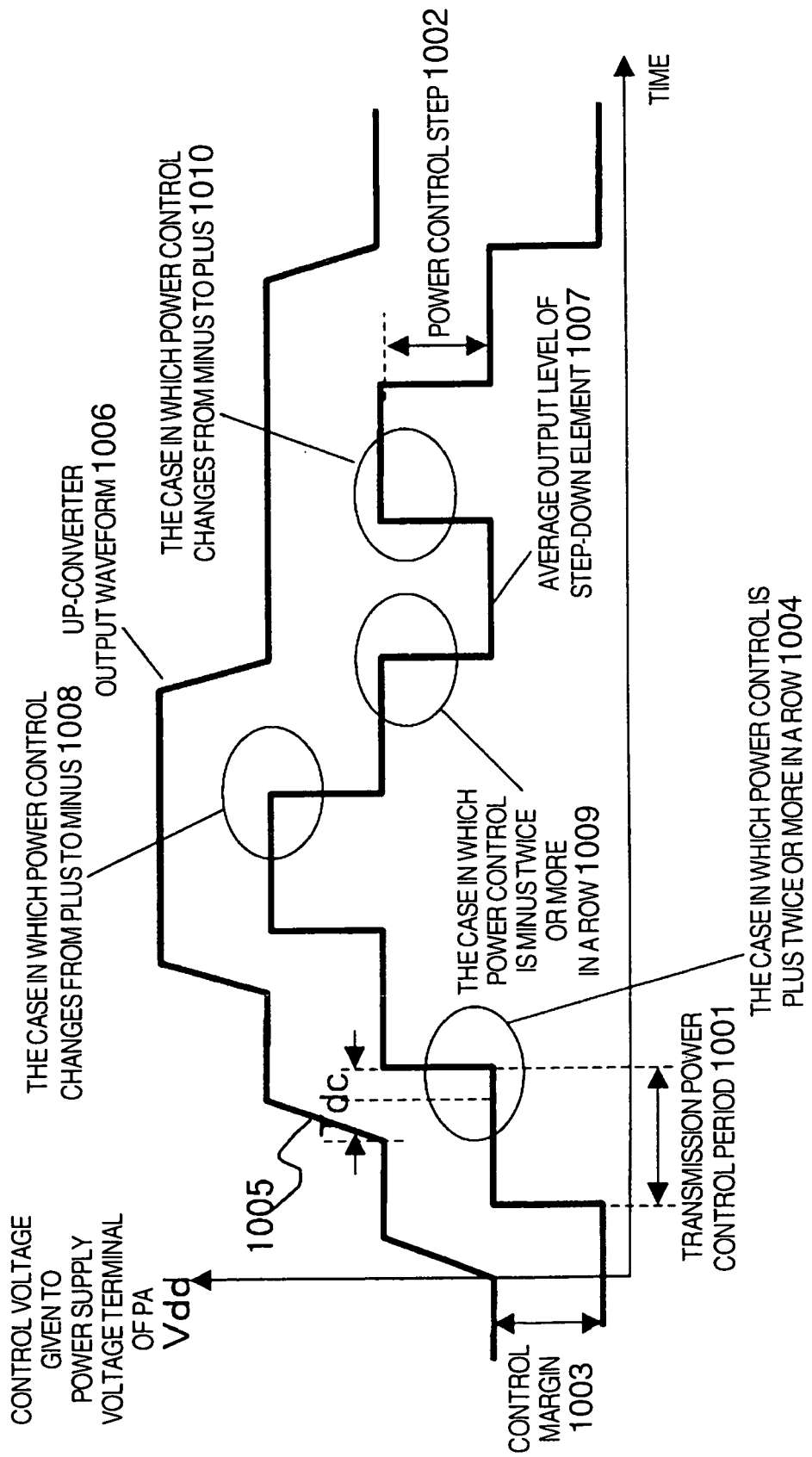
FIG. 10 is a diagram showing a third embodiment of transmission power control according to the present invention.

Next, with reference to FIG. 10, a third embodiment of the transmission output control according to the present invention will be described. In a wireless communication standard such as W-CDMA, a base station and a terminal monitor a wireless communication state between them each other to perform closed loop transmission power control such that communication can be performed with a proper power. In an example of the W-CDMA (DS-FDD system of a 3GPP standard), a transmission power of a wireless terminal changes by ±1 power control step 1002 (1 dBm in the case of normal transmission) in conformity with timing of a slot head in each control period 1001 (1 slot=667 μs). A method corresponding to this transmission power control in the transmission system structure according to the present invention will be described.

(1) In the case of increasing a transmission power by one power control step (In the case of increasing a transmission power twice or more in a row)

In this embodiment, a transmission power is controlled by an up-converter so as to be constant at a value slightly higher than a required power supply voltage control value for obtaining a transmission power required as a result of the control, and a control voltage is decreased to a required value by a step-down element, whereby high-speed envelope modulation is performed. It is desirable to set an up-converter control margin 1003 to the same degree as a PAPR which depends upon a modulation system of a transmission system. In a course of transmission power control, in the case where power control is in a plus (increasing) direction twice in a row (1004 in the figure), control of the up-converter is started earlier by the time of Tdc (1005) in conformity with timing for increasing a transmission power actually. An output voltage waveform of the up-converter is denoted by reference numeral 1006, and an average output voltage level of the step-down element is denoted by 1007.

(2) In the case of decreasing a transmission power by one power control step (In the case of changing power control from plus to minus)

In a course of transmission power control, in the case where power control changes from plus (increased) to minus (decreased) (1008 in the figure), since a control voltage cannot be decreased earlier than timing for actually decreasing a transmission power as in the case of increasing a control voltage, a control voltage of the up-converter is coped with by keeping the same output level as the previous time in the next transmission power control period and increasing a voltage by an amount decreased by the step-down element.

(3) In the case of decreasing a transmission power by one power control step (In the case of decreasing a transmission power twice or more in a row)

In a course of transmission power control, in the case where power control is minus (decreased) twice or more in a row (1009 in the figure), a control voltage of the up-converter is decreased by an amount equivalent to a control step in conformity with timing for decreasing a transmission power actually. Since an allowance equivalent to one control step is generated in the control margin of the up-converter in the stage of above (2), the up-converter can be operated prior to an actual changing point.

(4) In the case of increasing a transmission power by one power control step (In the case of changing power control from minus to plus)

In a course of transmission power control, in the case where power control changes from minus (decreased) to plus (increased) (1010 in the figure), a control voltage of the up-converter is coped with by keeping the same output level as the previous time in the next transmission power control period and decreasing a voltage equivalent to an amount decreased by the step-down element. Since an allowance equivalent to one control step is generated in the control margin of the up-converter in the stages of (2) and (3), it is unnecessary to increase a power anew.

Note that, although a first potential difference generation apparatus of an amplitude modulation circuit is illustrated with an up-converter as an example in the present invention, a more efficient circuit can be realized if an up-down converter capable of performing both step-up and step-down is used. In addition, the control method in the third embodiment of control is also applicable to a circuit using a down-converter for performing only step-down, and the same effect can be obtained with the down-converter.

In the present invention, the conventional linear system and EER system are used in combination such that the EER system, which uses a saturation amplifier with a higher efficiency compared with the linear amplifier, can also be used in a terminal for a wireless communication system such as a cellular phone with a wide output dynamic range. The use of the EER system is limited to a time when an output power is a fixed amount or more and the linear system is used in a low output range as in the past, whereby power consumption of a terminal is reduced while the requirement of linearity is satisfied. In addition, the up-converter is combined with a step-down element with high responsiveness, whereby a power supply voltage control circuit for the EER system with a wide control range and high responsiveness is provided.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A circuit which amplifies a transmission signal inputted from a base band unit according to a transmission output and outputs the transmission signal to a front-end unit in a wireless communication apparatus, the circuit comprising:
    a quadrature modulator which subjects the transmission signal inputted from said base band unit to frequency conversion;
    an automatic gain control amplifier (AGC) amplifier which amplifies the signal subjected to frequency conversion according to the transmission output;
    a power amplifier which amplifies the transmission signal amplified by said AGC amplifier and outputs the transmission signal to said front-end unit; and
    an amplitude modulation circuit which modulates a power supply voltage of said power amplifier,
    wherein, in the case where the transmission output of the transmission signal is larger than a predetermined threshold value, said amplitude modulation circuit inputs a power supply voltage control signal corresponding to an amplitude of the transmission signal to said power amplifier, and said power amplifier amplifies a signal, which is inputted based upon the power supply voltage control signal inputted from said amplitude modulation circuit, in an envelope elimination and restoration (EER) system,
    in the case where the transmission output of the transmission signal is equal to or smaller than the predetermined threshold value, said amplitude modulation circuit amplifies the transmission signal to be linear, and
    the predetermined threshold value is set based upon a linear region suitable for using said power amplifier as a linear power amplifier and a saturation region suitable for using said power amplifier as a saturation power amplifier, which are decided according to characteristics of said power amplifier.

2. The circuit according to claim 1, further comprising a conversion unit which separates the transmission signal inputted from said base band unit into a plurality of components and outputs the transmission signal,
    wherein, in the case where the transmission output of the transmission signal is larger than the predetermined threshold value,
    said conversion unit separates the transmission signal inputted from said base band unit into an amplitude component and a phase component and further converts the phase component into an I component and a Q component on a unit circle, and outputs the amplitude component of the transmission signal, the I component on the unit circle of the transmission signal, and the Q component on the unit circle of the transmission signal,
    said amplitude modulation circuit inputs a power supply voltage control signal, which corresponds to the amplitude component of the transmission signal outputted to said conversion unit, to said power amplifier, and
    said quadrature modulator subjects the I component on the unit circle of the transmission signal of the transmission signal outputted from said conversion unit and the Q component on the unit circle of the transmission signal to frequency conversion.

3. The circuit according to claim 1,
    wherein, in the case where the transmission output of the transmission signal is equal to or smaller than the predetermined threshold value, the circuit outputs the transmission signal amplified by said AGC amplifier to said front-end unit without amplifying the transmission signal by said power amplifier.

4. The circuit according to claim 1,
    wherein, in comparing the transmission output of the transmission signal and the predetermined threshold value, the circuit uses a gain control signal supplied from said base band unit.

5. The circuit according to claim 1, further comprising:
    a conversion unit which separates the transmission signal inputted from said base band unit into a plurality of components and outputs the transmission signal as a digital signal; and
    first and second digital-to-analog converter (DAC) sections which convert the digital signal outputted from said conversion unit into an analog signal,
    wherein said conversion unit compares the transmission output of the transmission signal and the predetermined threshold value,
    in the case where the transmission output of the transmission signal is equal to or smaller than the predetermined threshold value, said conversion unit inputs an I component of the transmission signal and a Q component of the transmission signal to any one of said first or second DAC sections,
    in the case where the transmission output of the transmission signal is larger than the predetermined threshold value, said conversion unit inputs a phase component of the transmission signal to said first DAC section and inputs an amplitude component of the transmission signal to said second DAC section,
    said first DAC section is connected to said quadrature modulator,
    said second DAC section is connected to said quadrature modulator in the case where the transmission output of the transmission signal is equal to or smaller than the predetermined threshold value and is connected to said amplitude modulation circuit in the case where the transmission output of the transmission signal is larger than the predetermined threshold value.

6. The circuit according to claim 1,
wherein, in the case where the transmission signal is amplified to be linear, the predetermined threshold value is set as a first value,
in the case where the inputted signal is amplified with the EER system, the predetermined threshold value is set as a second value, and
a transmission output represented by the first value is higher than a transmission output represented by the second value.

7. A circuit which amplifies a transmission signal inputted from a base band unit according to a transmission output and outputs the transmission signal to a front-end unit in a wireless communication apparatus, the circuit comprising:
a quadrature modulator which subjects the transmission signal inputted from said base band unit to frequency conversion;
an automatic gain control amplifier (AGC) amplifier which amplifies the signal subjected to frequency conversion according to the transmission output;
a limiter which inputs the transmission signal amplified by said AGC amplifier to a power amplifier;
a power amplifier which amplifies the transmission signal inputted from said limiter and outputs the transmission signal to said front-end unit;
an envelope detection section which extracts and outputs amplitude information of the transmission signal inputted from said base band unit; and
an amplitude modulation circuit which modulates a power supply voltage of said power amplifier based upon the amplitude information outputted from said envelope detection section,
wherein said limiter applies clipping to the transmission signal amplified by said AGC amplifier in the case where an amplitude of the transmission signal amplified by said AGC amplifier is larger than a third threshold value,
in the case where clipping is not applied by said limiter, said amplitude modulation circuit uses a linear region of said power amplifier to amplify the transmission signal amplified by said AGC amplifier to be linear, and
in the case where clipping is applied by said limiter, said amplitude modulation circuit inputs a power supply voltage control signal, which corresponds to the amplitude information inputted from said envelope detection section, to said power amplifier, and uses a saturation region of said power amplifier to amplify the transmission signal amplified by said AGC amplifier.

8. The circuit according to claim 7,
wherein whether or not clipping has been performed by said limiter is judged by monitoring a base current value of said limiter.

9. A circuit which amplifies a transmission signal inputted from a base band unit according to a transmission output and outputs the transmission signal to a front-end unit in a wireless communication apparatus, the circuit comprising:
a conversion unit which separates the transmission signal inputted from said base band unit into a plurality of components and outputs the transmission signal;
a quadrature modulator which subjects the transmission signal inputted from said conversion unit to frequency conversion;

a power amplifier which amplifies the signal subjected to frequency conversion and outputs the signal to said front-end unit; and
an amplitude modulation circuit which modulates a power supply voltage of said power amplifier based upon an output from said conversion unit;
wherein said amplitude modulation circuit includes a combination of a first potential difference generation device, which steps up or steps down the power supply voltage of said power amplifier as required based upon an output from said conversion unit, and a second potential difference generation device which steps down the output voltage of said first potential difference generation device, and
the circuit generates, in said conversion unit, first and second amplitude modulation control signals with respect to said first and second potential difference generation devices, respectively, based upon an amplitude modulation signal, transmission power level information, and transmission channel parameter setting information of the transmission signal.

10. The circuit according to claim 9,
wherein a device having a high power conversion efficiency compared with said second potential difference generation device is used as said first potential difference generation device, and
a device having a high output voltage variable speed compared with said first potential difference generation device is used as said second potential difference generation device.

11. The circuit according to claim 9,
wherein, in generating the first and second amplitude modulation control signals,
the circuit refers to a modulation system to be used, the number of channels to be simultaneously multiplexed and sent, a transmission power ratio among channels, each channel output, and a bit adjustment method for an output after synthesizing as transmission channel parameters.

12. The circuit according to claim 9,
wherein the circuit is used in a wireless communication system which performs closed loop transmission power control, follows closed loop transmission power control with amplitude modulation control using said first potential difference generation device, controls instantaneous fluctuation of an envelope with amplitude modulation control using said second potential difference generation device, always keeps a sum of a desired average transmission power level and a maximum value of an instantaneous fluctuation range of an envelope at a value equal to or more than the desired average transmission power level as a target value based upon the first amplitude modulation control signal, and decreases the maximum value to a predetermined value based upon the second amplitude modulation control signal.

13. The circuit according to claim 12,
wherein, in the case where a power is increased in two control periods in a row or decreased in two control periods in a row by the transmission power control,
the circuit controls amplitude modulation control of said first potential difference generation device earlier than transmission power control timing, which is decided in a standard of said wireless communication system, according to an output voltage variable speed of said second potential difference generation device, and in the case where a control direction of transmission power control changes from plus to minus or minus to plus, keeps a value of one control period earlier without change as a target value of amplitude modulation control of said first potential difference generation device.

14. The circuit according to claim 9, wherein the circuit enlarges a control range by stepping up a control value to a power supply voltage or more in said first potential difference generation device.

15. The circuit according to claim 14, wherein the circuit judges whether or not to perform step-up or/and to perform switching of a linear system and an envelope elimination and restoration (EER) system by comparing a level of the transmission signal inputted from said base band unit with a predetermined threshold value, and corrects delay due to the judgment processing by also delaying the transmission signal by the same amount.

16. The circuit according to claim 14, wherein the circuit performs judgment on whether or not to perform step-up or/and to perform switching of a linear system and an EER system only once in a fixed control period rather than sequentially, thereby reducing control load.

17. The circuit according to claim 14, wherein, in the case where a period in which step-up is not performed continues, the circuit stops or suspends step-up judgment itself according to conditions of parameters related to judgment on step-up or/and switching between systems.

18. The circuit according to claim 9, wherein said conversion unit is integrated on a circuit or a module which is identical with any one of said base band unit, said quadrature modulator, and said amplitude modulation circuit.

19. The circuit according to claim 9, wherein said amplitude modulation circuit is integrated on a circuit or a module which is identical with said quadrature modulator or said power amplifier.

* * * * *